(12) United States Patent
Terasaki et al.

(10) Patent No.: US 11,789,058 B2
(45) Date of Patent: *Oct. 17, 2023

(54) STATIC ELECTRICITY-VISUALIZING MATERIAL, STATIC ELECTRICITY-VISUALIZING FILM, STATIC ELECTRICITY DISTRIBUTION-VISUALIZING DEVICE, AND STATIC ELECTRICITY DISTRIBUTION-VISUALIZING METHOD

(71) Applicant: National Institute of Advanced Industrial Science and Technology, Tokyo (JP)

(72) Inventors: Nao Terasaki, Tosu (JP); Kazuya Kikunaga, Tosu (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 481 days.

This patent is subject to a terminal disclaimer.

(21) Appl. No.: 16/624,278

(22) PCT Filed: Jun. 20, 2018

(86) PCT No.: PCT/JP2018/023414
§ 371 (c)(1),
(2) Date: Dec. 18, 2019

(87) PCT Pub. No.: WO2019/009071
PCT Pub. Date: Jan. 10, 2019

(65) Prior Publication Data
US 2020/0116773 A1    Apr. 16, 2020

(30) Foreign Application Priority Data
Jul. 7, 2017 (JP) .................. 2017-133345

(51) Int. Cl.
*G01R 29/02* (2006.01)
*C09K 11/77* (2006.01)
(Continued)

(52) U.S. Cl.
CPC .............. *G01R 29/24* (2013.01); *C09K 11/02* (2013.01); *C09K 11/7734* (2013.01); *G01R 29/14* (2013.01)

(58) Field of Classification Search
CPC .... C09K 11/02; C09K 11/7734; G01R 29/24; G01R 29/14
See application file for complete search history.

(56) References Cited

U.S. PATENT DOCUMENTS 5,420,743 A * 5/1995 Domes .................. G01R 29/24
361/221
2008/0232083 A1  9/2008 Xu
2016/0154042 A1  6/2016 Kikunaga

FOREIGN PATENT DOCUMENTS

GB      2430441      *   3/2007
JP   H11-352170 A      12/1999
(Continued)

OTHER PUBLICATIONS

International Search Report for International Application No. PCT/JP2018/023414 dated Sep. 25, 2018 (5 sheets, 3 sheets translation, 8 sheets total).
(Continued)

*Primary Examiner* — Feba Pothen
(74) *Attorney, Agent, or Firm* — Kratz, Quintos & Hanson, LLP

(57) ABSTRACT

[Problem]
The object of the present invention is to provide a static electricity distribution-visualizing material, a static electricity-visualizing film, a static electricity distribution-visualiz-
(Continued)

ing device, and a static electricity distribution-visualizing method, which can visualize a charged state to be seen with naked eyes so as to intuitively understand a static electricity distribution.

[Solution]

A static electricity distribution-visualizing material is manufactured so as to contain at least one of a fluorescent substance, a luminescent substance, an electroluminescent substance, a fractoluminescent substance, a photochromic substance, an afterglow substance, a photostimulated luminescent substance and a mechanoluminescent substance.

26 Claims, 9 Drawing Sheets

(51) Int. Cl.
*G01R 29/14* (2006.01)
*G01R 29/24* (2006.01)
*C09K 11/02* (2006.01)

(56) References Cited

FOREIGN PATENT DOCUMENTS

| KR | 19990069662 | * | 9/1999 |
| KR | 20060081077 A | * | 7/2006 |
| WO | 2005/097946 A1 | | 10/2005 |
| WO | 2015/011942 A1 | | 1/2015 |
| WO | 2016/092685 A1 | | 6/2016 |
| WO | 2016/098148 A1 | | 6/2016 |
| WO | 2017/177234 A1 | | 10/2017 |

OTHER PUBLICATIONS

Written Opinion of the International Searching Authority for International Application No. PCT/JP2018/023414 dated Sep. 25, 2018 (4 sheets).

* cited by examiner

STATIC ELECTRICITY-VISUALIZING MATERIAL, STATIC ELECTRICITY-VISUALIZING FILM, STATIC ELECTRICITY DISTRIBUTION-VISUALIZING DEVICE, AND STATIC ELECTRICITY DISTRIBUTION-VISUALIZING METHOD

TECHNICAL FIELD

The present invention relates to a static electricity-visualizing material, a static electricity-visualizing film, a static electricity distribution-visualizing device, and a static electricity distribution-visualizing method, which make it possible to visualize a charged state of static electricity charged on various parts and devices.

BACKGROUND ART

In Japan, various manufacturing sectors support foundation of industries such as semiconductor manufacture, electronic/electric equipment manufacture, precision machine manufacture, transportation machine manufacture, chemical manufacture, fiber manufacture, ceramic manufacture, pharmaceutical manufacture and food manufacture. In factories responsible for actual manufactures in such manufacturing sectors, products are assembled in an automatic process or an artificial process with many parts flowing through a production line.

Herein, there are problems that defects or failures in parts constituting a product, or defects or failures in a manufacturing process naturally cause defects or failures in a manufactured product, resulting in a decreased yield for manufacture. Alternatively, even if the parts have no problem, the manufactured product may have defects or failures for various reasons. Problems associated with both the former and the latter include a problem that malfunction in each step in the automatic manufacturing process decreases a manufacturing speed (manufacturing efficiency) and a yield of products.

Conventionally, mainly in large companies, there have been many cases that a series of processes of research, development, design, manufacture, quality control, and sales has been implemented in a vertically integrated manner. Such vertical integration-type companies are under such an environment that feedback and feedforward between poor quality and decreased yield of products (finished products and semi-finished products) at the manufacturing site and solutions against them by development and design are likely to be made within the same company.

On the other hand, in recent years, a manufacturing department (i.e. manufacturing factory) in the same company is separated as a subsidiary due to a problem of manufacturing costs, or manufacturing companies that conduct only subcontract manufacture have appeared. Similarly, fabless companies that conduct only research and development and do not conduct manufacture are also rising mainly in the fields of electricity, information communication, and the like.

As described above, in the current manufacturing sector, there is increasing physical, temporal, technical or human dissociation between development/design areas and actual manufacture areas. When there is such dissociation, it is difficult to feed-back and feed-forward information of poor quality and decreased yield caused in a manufacturing site between the manufacturing site and the development site. Due to such difficulty, there is a concern that the manufacturing power in Japan's manufacturing sector (including subcontract manufacturers contracting only for manufacturing, manufacturing subsidiaries, fabless companies, and the like) is declining.

There are various causes for deteriorating quality and yield at manufacturing sites. Although there are inevitable causes such as ease of design and manufacture, proficiency at a manufacturing site, manufacturing process flow, manufacturing facilities and human skill, static electricity is one of hidden causes. That is, there are various causes of such defects and failures in parts, products or manufacturing processes, and static electricity is considered as one of the causes.

In manufacturing factories, in consideration of such adverse effects of static electricity on parts, products, manufacturing processes and the like, ingenuities for preventing influence of static electricity on the parts, products and manufacturing processes have been exercised by devising destaticization, static protection for facilities, floors, walls and the like of a factory, static protection for worker's clothes, or the like. Specifically, ingenuities such as destaticization of floors, walls, conveyor lines and the like before start of work, and installation of a ground for destaticization are exercised, so that parts and products used in the manufacturing process are not electrostatically charged.

In addition, in the manufacturing factory, ingenuities such as previous destaticization of parts used in the manufacturing process are also exercised. Similarly, ingenuities that workers start work after destaticization are also exercised.

As described above, in the manufacturing factory, various ingenuities for reducing adverse effects of static electricity are exercised.

Despite such ingenuities, the problem that parts and products used in the manufacturing process are electrostatically charged has not been completely solved. For example, electronic instruments, precision instruments and the like manufactured in a manufacturing factory have been reduced in power consumption. With the reduction in power consumption, electrostatic dischargeability of the parts used in manufacturing these electronic instruments and precision instruments has been decreased. Thus, the parts used for manufacturing these electronic instruments and precision instruments are often electrostatically charged and easily break down.

There are various types of parts used for manufacturing such electronic instruments and precision instruments. For example, many parts made of resin or vinyl (connector, screen cover, housing, and the like) are also used. These parts have a certain size and, in some cases, unpredictably behaves when electrostatically charged.

For example, a plurality of parts may progress to a process that the parts flow through a conveyor line and are arranged at certain positions, or a process of appearance inspection by image processing. In such processes, it is desired that a plurality of parts introduced into the conveyor line flow through the conveyor line while keeping an interval at the introduction.

However, when such parts are electrostatically charged, the parts approach or repel to leave each other due to static electricity in the conveyor line. In some cases, adjacent parts bond to each other. If such a behavior occurs, appropriate processing cannot be performed in the aforementioned arrangement process and appearance inspection process, and a product may be automatically determined as a defective product although it is a nonconforming article.

If such an unpredictable behavior of parts occurs in the arrangement process or the appearance inspection process, it is necessary to stop the conveyor line once. Although the cause of this behavior can be predicted to be static electricity, the countermeasure is only destaticization for all of the instruments on the conveyor line or the processes, and the parts introduced into the conveyor line. Stopping the conveyor line for such destaticization causes a large damage on the manufacturing factory. This is because the manufacturing operation is stopped during the destaticization (in some cases, it takes half a day or one day).

Although it is known that the aforementioned behavior of the parts may be caused by static electricity, an actual mechanism leading to the behavior is largely uncertain. In particular, the parts may show different behaviors of approaching or leaving each other, or may show no behaviors. For this reason, it is difficult to elucidate the mechanism leading to these behaviors without knowing how static electricity (possibly) charged on the parts is distributed on the parts. If it is difficult to elucidate the mechanism, definitely a countermeasure for preventing the aforementioned behavior cannot be examined.

In addition, a cover formed of resin, vinyl or the like, which is attached to a screen of a mobile phone, a smartphone, or the like is easily electrostatically charged due to its material and its large area. When such a part is used in an assembly process of an electronic equipment or a precision equipment, an installation position may be arbitrarily displaced due to static electricity by electrostatic charging of the part. Under such a circumstance, definitely an assembled instrument becomes defective.

Also in this case, although it can be expected that the cause is electrostatic charging, the relationship between the behavior and electrostatic charging is not known. The problem cannot be solved unless this relationship is known. That is, it is a prerequisite for solving problems caused in the manufacturing process to clearly grasp what kind of static electricity is charged on parts and the like. In other words, it is a prerequisite for elucidating the behaviors of parts to be able to confirm how the electrostatic charging is distributed in the parts and the like.

Furthermore, for an equipment using static electricity, such as a printer, it is necessary to confirm a static electricity distribution in parts using electrostatic charging.

As described above, on a prerequisite for solving various problems possibly resulting from static electricity in the manufacturing process or the like, and on a prerequisite for confirming performance and characteristics of parts using static electricity, it is desirable to be able to accurately and easily measure a charged quantity distribution of static electricity in parts and the like.

In addition, as a device for measuring such a static electricity distribution, an electrostatic charging-measuring method has been proposed in which an electrostatic charging distribution of a measurement object is measured by scanning a position where vibration is applied to the measurement object and measuring an electromagnetic wave generated in association with the vibration (see Patent Document 1).

PRIOR ART DOCUMENTS

Patent Documents

Patent Document 1: WO2012/108258

SUMMARY OF INVENTION

Problem to be Solved

However, the aforementioned electrostatic charging-measuring method (Patent Document 1) needs to locally vibrate the measurement object and thus cannot be applied to a measurement object which cannot be locally vibrated, which is a problem. Also, for this method, the generated electromagnetic wave must be measured and visualized by a computer or the like, and there is a problem that it is difficult to intuitively grasp how static electricity is distributed on a surface of a measurement object.

Furthermore, the electrostatic charging-measuring method in Patent Document 1 has a problem that only a relatively flat face can be measured, and a complicated three-dimensional static electricity distribution cannot be measured.

The object of the present invention is to provide a static electricity-visualizing material, a static electricity-visualizing film, a static electricity distribution-visualizing device, and a static electricity distribution-visualizing method, which makes it possible to intuitively understand a static electricity distribution by causing a charged region to emit light to visualize the charged region so that the charged region can be seen even with naked eyes.

Solution to Problem

The inventor of the present invention has continued research on static electricity, and for the first time in the world, the inventor has found a characteristic that the following fluorescent substance, luminescent substance, electroluminescent substance, breaking luminescent substance, photochromic substance, afterglow substance, photostimulated luminescent substance, and mechanoluminescent substance emit light by electrostatic charging, or by external stimulation in the charged state. Then, the inventors has found the following revolutionary static electricity-visualizing material, static electricity-visualizing film, static electricity distribution-visualizing device, and static electricity distribution-visualizing method, which make it possible to visualize a static electricity distribution on a surface of a measurement object by utilizing the aforementioned property.

A first aspect of the present invention consists in a static electricity-visualizing material containing at least one of a fluorescent substance, a luminescent substance, an electroluminescent substance, a fractoluminescent substance, a photochromic substance, an afterglow substance, a photostimulated luminescent substance and a mechanoluminescent substance.

Herein, the term "fluorescent substance" refers to a substance which emits light by absorbing energy such as X-ray, ultraviolet ray and visible ray with which the substance is irradiated. Examples of the fluorescent substance include: ZnS:Ag+(Zn, Cd)S:Ag; $Y_2O_2S$:Eu+$Fe_2O_3$; ZnS:Cu, Al; ZnS:Ag+$CoAl_2O_3$; $Zn_2SiO_4$:Mn; ZnS:Ag, Cl; ZnS:Zn; (KF, $MgF_2$):Mn; (Zn. Cd)S:Ag; (Zn, Cd)S:Cu; ZnO:Zn; (Zn, Cd)S:Cu; ZnS:Cu; ZnS:Cu, Ag; $MgF_2$:Mn; (Zn, Mg)$F_2$:Mn; $Zn_2SiO_4$:Mn; ZnS:Ag+(Zn, Cd)S:Cu; $Gd_2O_2S$:Tb; $Y_2O_2S$:Tb; $Y_2O_2S$:Tb; $Y_1Al_5O_{12}$:Ce; $Y_3(Al, Ga)_5O_{12}$:Ce; $Y_2SiO_5$:Ce; $Y_3Al_5O_{12}$:Tb; $Y_3(Al, Ga)_5O_{12}$:Tb; ZnS:Ag, Al; $InBO_3$:Tb; $InBO_3$:EU; ZnS:Ag; ZnS:Cu, Al; ZnS:Cu, Au. Al; $Y_2SiO_5$:Tb; (Zn, Cd)S:Cu; Cl+(Zn, Cd)S:Ag, CL; $InBO_3$:Tb+$InBO_3$:Eu; ZnS:Ag+ZnS:Cu+$Y_2O_2S$:Eu; $InBO_3$:Tb+$InBO_3$:Eu+ZnS:Ag; (Ba, Eu)$Mg_2Al_{16}O_{27}$; (Ce, Tb)$MgAl_{11}O_{19}$; (Y, Eu)$_2O_3$; (Sr, Eu, Ba, Cf)$_5$(PO$_4$)$_3$CL; (La, Ce, Tb)PO$_4$; $Y_2O_3$:Eu; LaPO$_4$:Ce, Tb; (Sr, Cf, Ba)$_{10}$(PO$_4$)$_6$CL$_2$:Eu; (La, Ce, Tb)PO$_4$:Ce, Tb; $Zn_2SiO_4$:Mn; $Zn_2SiO_4$:Mn; Sb$_2O_3$; Ce$_{0.67}$Tb$_{0.33}$MgAl$_{11}$O$_{19}$:Ce, Tb; $Y_2O_3$:Eu(III); Mg$_4$(F)GeO$_6$:Mn; Mg$_4$(F)(Ge, Sn)O$_6$:Mn; CaWO$_4$; CaWO$_4$:Pb; (Ba, Ti)$_2$P$_2$O$_7$:Ti; Sr$_2$P$_2$O$_7$:Sn; Cf$_5$F $(PO_4)_3$:Sb; $Sr_5F(PO_4)_3$:Sb, Mn; $BaMgAl_{10}O_{17}$:Eu, Mn; $BaMg_2Al_{16}O_{27}$:Eu(II); $BaMg_2Al_{16}O_{27}$:Eu(II), Mn(II); $Sr_5Cl(PO_4)_3$:Eu(II); $Sr_6P_5BO_{20}$:Eu; (Cf, Zn, Mg)$_3(PO_4)_2$: Sn; (Sr, Mg)$_3(PO_4)_2$:Sn; $CaSiO_3$:Pb, Mn; $Cf_5F(PO_4)_3$:Sb, Mn; $Cf_5(F, Cl)(PO_4)_3$:Sb, Mn; (Cf, Sr, Ba)$_3(PO_4)_2Cl_2$:Eu; $3Sr_3(PO_4)_2SrF_2$:Sb, Mn; Y(P, V)$O_4$:Eu; (Zn, Sr)$_3(PO_4)_2$: Mn; $Y_2O_2S$:Eu; (Sr, Mg)$_3(PO_4)_2$:Sn(II); $3.5MgO_{0.5}MgF_2GeO_2$:Mn; $Cf_3(PO_4)_2CaF_2$:Ce, Mn; $SrAl_2O_7$:Pb; $BaSi_2O_5$:Pb; $SrFB_2O_3$:Eu(II); $SrB_4O_7$:Eu; $Gd_2O_2S$:Tb; $Gd_2O_2S$:Eu; $Gd_2O_2S$:Pr, $Gd_2O_2S$:Pr, Ce, F; $Y_2O_2S$:Tb; $Y_2O_2S$:Tb; $Y_2O_2S$:Tb; Zn(0.5)Cd(0.4)S:Ag; Zn(0.4)Cd(0.6)S; Ag; $CdWO_4$; $CaWO_4$; $MgWO_4$; $Y_2SiO_5$: Ce; $YAlO_3$:Ce; $Y_3Al_5O_{12}$:Ce; $Y_3(Al, Ga)_5O_{12}$:Ce; CdS; ZnO:Ga; ZnO:Zn; (Zn; Cd)S:Cu, Al; ZnO:Zn; (Zn, Cd)S: Cu, Al; ZnS:Cu, Al; ZnCdS:Ag; ZnS:Ag; $Zn_2SiO_4$:Mn; ZnS:Cu; CsI:Tl; LiF/ZnS:Ag; LiF/ZnS:Cu, Al, Au; a fluorescein-based fluorescent substance typified by fluorescein isothiocyanate; a porphyrin-based fluorescent substance typified by porphyrin and platinum porphyrin; an organic dye-based fluorescent substance typified by Rhodamine, azobenzene derivatives, and anthracene; metal complex-based fluorescent substance typified by ruthenium tris bipyridyl; luminescent polymer-based fluorescent substance typified by poly (1,4-phenylenevinylene), poly (1,4-phenylene), a polyfluorene, and poly(thiophene); other substances such as $Y_2O_2$:Eu; and the like.

In addition, the term "luminescent substance" refers to a luminescent substance other than a fluorescent substance, which is a substance capable of emitting light by X-ray, ultraviolet ray, visible light or the like, and a substance capable of emitting light by chemical change or biological enzymes. Specific examples of the luminescent substance include: phosphorescent luminescent materials such as iridium completes (typified by tris (2-phenylpyridinate) iridium (III)) and platinum complexes; chemiluminescent substances typified by luminol, rofin, lucigenin and oxalate; photosensitive luminescent dye such as 9,10-diphenylanthracene, 9,10-bis (phenylethynyl) anthracene, tetracene, 1-chloro-9,10-bis (phenylethynyl) anthracene, 5,12-bis (phenylethynyl) naphthacene, rubrene, Rhodamine 6G and Rhodamine B; bioluminescent substances typified by luminol; and the like.

The term "electroluminescent substance" refers to a substance that emits light by applying an electric field. Specific examples of the electroluminescent substance include: a low molecular weight luminescent substances such as tris (8-quinolinolato) aluminum complex (Alq), bis (benzoquinolinolato) beryllium complex (BeBq), tri (dibenzoylmethyl) phenanthroline europium complex (Eu (DBM) 3 (Phen)), ditoluylvinylbiphenyl (DTVBi) and rubene; π-conjugated polymer luminescent substances such as poly (p-phenylenevinylene) and polyalkylthiophene; and the like.

The term "fractoluminescent substance" refers to a substance that emits light in association with breakage due to mechanical stimulation such as destruction and friction. Specific examples of the fractoluminescent substance include: an inorganic material such as dolomite, muscovite, quartz, trilithionite, pectolite, fluorite and polylithionite; an organic material such as an Eu (TTA) 3 type, a carbazole derivative, an anthranilic acid type and a sugar; and the like.

The term "photochromic substance" refers to a substance which shows change in physical characteristics such as color by irradiation with X-ray, ultraviolet ray or visible ray. Specific examples of the photochromic substance include: an organic pigment typified by a spiropyran type, a diarylethene type and a fulgide type; an inorganic material typified by barium magnesium silicate ($BaMgSiO_4$); and the like.

The term "afterglow substance" refers to a substance which accumulates lights (electromagnetic waves) of visible ray, ultraviolet ray and the like with which the substance is irradiated, and emits the lights even when the irradiation is stopped. Specific examples of the afterglow substance include a radium compound, a promethium compound, a zinc sulfide (ZnS type), a strontium aluminate ($SrAl_2O_4$ type) and the like, and a zinc sulfide (ZnS type) and a strontium aluminate ($SrAl_2O_4$ type) to which monovalent to trivalent metal ions such as Dy and Eu are added in an arbitrary proportion are preferable. Herein, the term "add" refers to a concept that includes "co-doping", which means simultaneous addition of two or more substances, and "activation".

The term "photostimulated luminescent substance" refers to a substance which emits light by excitation of visible or infrared ray after irradiation with a high-energy laser, radiation or the like. Specific examples of the photostimulated luminescent substance include $BaFX:Eu^{2+}$ (X represents Br or I) and the like.

The term "mechanoluminescent substance" refers to a substance which emits light (including visible ray, ultraviolet ray, near-infrared ray) through deformation caused by a mechanical external force. Examples of the mechanoluminescent substance include: a substance mainly composed of an oxide, a sulfate, a selenide or a telluride which has a spinel structure, a corundum structure, a β-alumina structure, a silicate, a defect-controlling aluminate and a structure with coexistence of a wurtzite type structure and a sphalerite type structure, and the like: and a substance in which at least a part of alkali metal ions and alkali earth metal ions constituting the above-described structure is substituted by at least one metal ion of rare earth metal ions and transition metal ions; and the like.

Also, the mechanoluminescent substances are classified into an alumina type, a silica type, a phosphoric acid type, a titanium oxide type, a zinc sulfide type and others.

Specific examples of the alumina type include: $xSrO \cdot yAl_2O_3 \cdot zMO$ (M represents a divalent metal Mg, Ca or Ba; each of x, y and z represents an integer. Note that M is not limited as long as it is a divalent metal, but Mg, Ca and Ba are preferable. In addition, x, y and z represents an integer equal to or larger than 1.); $Al_2(O_3:Tb^{3+}$; $SrAl_2O_4$:M (doped with M=at least one of $Eu^{2+}$, $Dy^{3+}$, $Ce^{3+}$ and $Ho^{3+}$); $ZnAl_2O_4$:M (doped with M=at least one of $Eu^{2+}$, $Mn^{2+}$, $Dy^{3+}$, $Ce^{3+}$ and $Ho^{3+}$); $SrAl_2O_4$:$Eu^{2+}$; $SrAl_2O_4$:$Ce^{3+}$; $SrAl_2O_4$:$Eu^{2+}$, $Dy^{3+}$; $SrAl_2O_4$:$Eu^{2+}$, $Ho^{3+}$; $SrAl_2O_4$:$Ho^{3+}$, $Ce^{3+}$; $XAl_2O_4$:M (doped with X=one or two of Sr, Ba, Mg, Ca and Zn, and doped with M=at least one of $Eu^{2+}$, $Dy^{3+}$, $Tb^{3+}$, $Ho^{3+}$); $SrAl_2O_4$:$Eu^{2+}$, $Cr^{3+}$, $Nd^{3+}$; and the like.

Other specific examples of the alumina type include: general formula $Sr\{1-(2x+3y+3z)/2\}$ $Al_2O_4:xEu^{2+}$, $yCr^{3+}$, $zNd^{3+}$ (here, each of x, v and z represents 0.25 to 10 mol %, preferably 0.5 to 2 mol %); $Sr_3Al_2O_6$:$Eu^{2+}$; $CaYAi_3O_7$:$Eu^{2+}$; $CaYAl_3O_7$:M (doped with M=at least one of $Eu^{2+}$, $Ce^{3+}$, $Dy^{3+}$, $Ce^{3+}$ and $Ho^{3+}$); $SrMgAl_{10}O_{17}$:$Ce^{3+}$; and the like.

Specific examples of the silica type include: $xSrO \cdot yAl_2O_3 \cdot zSiO_2$ (each of x, y and z represents an integer); $Ca_2Al_2Si_2O_7$:$Ce^{3+}$; $X_2Al_2SiO_7$:M (doped with X=one of Ca and Sr, and doped with M=at least one of $Eu^{2+}$, $Ce^{3+}$ and $Dy^{3+}$); $Ca_2MgSi_2O_7$:$Ce^{3+}$; $X_2MgSi_2O_7$:M (doped with X=one of Ba, Ca and Sr or $X_2$=one of SrCa and SrBa, and doped with M=at least one of $Eu^{2+}$, $Dy^{3+}$ and $Ce^{3+}$);

$CaAl_2Si_2O_8:Eu^{2+}$, $SrCaAl_2Si_2O_8:Eu^{2+}$; $Ca_3Y_2Si_3O_{12}:RE^{3+}$ (doped with $RE^{3+}$=at least one of $Dy^{3+}$ and $Eu^{2+}$); $BaSi_2O_2N_2:E^{2+}$; and the like.

Specific examples of the phosphoric acid type include: $Li_3PO_4:RE$ (RE=$Dy^{3+}$, $Tb^{3+}$, $Ce^{3+}$ or $Eu^{2+}$); $LiXPO_4:Eu^{2+}$ (X=one of Sr and Br); $Li_2BaP_2O_7:Eu^{2+}$; $CaZr(PO_4)_2:Eu^{2+}$; and the like.

Specific examples of the titanium oxide type include: $CaTiO_3:Pr^{3+}$; $BaCaTiO_3:Pr^{3+}$; $BaTiO_3$—$CaTiO_3:Pr^{3+}$; and the like.

Specific examples of the zinc sulfide type include: ZnS:M (M is not limited as long as it is bivalent metal, but is preferably Mn, Ga, Cu or the like; doped with M=at least one of $Mn^{2+}$, $Ga^{2+}$, $Te^{2+}$, $Cu^{2+}$, CuCl, Al); XZnOS:M (doped with X=one of Ca and Ba, and M=one of $Mn^{2+}$ and $Cu^{2+}$); ZnMnTe; and the like.

Other specific examples of mechanoluminescent substance include: $CaZrO_3:Eu^{3+}$; $CaNb_2O_n:Pr^{3+}$ (n=6 or 7); (Sr, Ca, Ba)(2)$SnO_4:Sm^{3+}$, $La^{3+}$; $Sr_{n+1}Sn_nO_{3n+1}:Sm^{3+}$ (n=1, 2 or more); $Y_2O_3:Eu^{2+}$; $ZrO_2:Ti$; $XGa_2O_4:Mn^{2+}$ (X=either one of Zr and Mg); and the like.

Each of the "fluorescent substance". "luminescent substance", "electroluminescent substance", "fractoluminescent substance", "photochromic substance", "afterglow substance", "photostimulated luminescent substance" and "mechanoluminescent substance" may have not only the property of each substance itself but also the properties of other substances. For example, the "mechanoluminescent substance" may have the property of the "fluorescent substance".

Also, the static electricity-visualizing material may contain substances other than the above-mentioned substances. Note that the substances other than the above-mentioned substances are not particularly limited.

The static electricity-visualizing material according to the first aspect can emit light by stimulation when a substance in the vicinity of the material is charged, and therefore it is possible to visually and easily detect whether or not the substance is charged.

A second aspect of the present invention consists in the static electricity-visualizing material according to the first aspect, characterized in that a weight ratio of the fluorescent substance, the luminescent substance, the electroluminescent substance, the breaking luminescent substance, the photochromic substance, the afterglow substance, the photostimulated luminescent substance, and the mechanoluminescent substance is 20 to 80 wt %.

The static electricity-visualizing material according to the second aspect can emit light with sufficient luminance (intensity) to be detected by a general industrial camera or the like, and therefore it is possible to more easily detect whether or not the substance in the vicinity of the static electricity-visualizing material is charged.

A third aspect of the present invention consists in the static electricity-visualizing material according to the first or second aspect, characterized in that the mechanoluminescent substance is: a substance represented by $SrAl_2O_4$ which is doped with $Eu^{2+}$; a substance represented by $SrAl_2O_4$ which is doped with at least one of $Eu^{2+}$, $Ho^{3+}$, $Dy^{2+}$, $M_1$, $M_2$ and $M_3$ ($M_1$, $M_2$, $M_3$=monovalent to trivalent metal ions different from each other); or a substance represented by $CaYAl_3O_7$ which is doped with $Eu^{2+}$.

The static electricity-visualizing material according to the third aspect can emit light with greater luminance (intensity) to be detected by a general industrial camera or the like, and therefore it is possible to more easily detect whether or not the substance in the vicinity of the static electricity-visualizing material is charged.

A fourth aspect of the present invention consists in a static electricity-visualizing film characterized in that the film is disposed on a surface of a measurement object and includes the static electricity-visualizing material according to any one of the first to third aspects.

Herein, the "static electricity-visualizing film" is not particularly limited as long as it is composed of a material containing at least one of the above-described substances. The static electricity-visualizing film may be prepared by homogenously mixing e.g. an epoxy resin or a urethane resin, a curing agent and a solvent for controlling crosslinking/curing reaction of these resins, the above-described substance, and a dispersant/adjuvant for homogenously dispersing the substance. In addition, the concentration (weight ratio) of the above-described substance contained in the static electricity-visualizing film is not particularly limited, but a range of 20 to 80 wt % is preferable because light emission can be visually confirmed, and a range of 50 to 70 wt % is more preferable because light emission can be visually confirmed more obviously. Note that, the "static electricity-visualizing film" may be directly formed (solution application/curing) on the surface of the measurement object, or alternatively a preformed "static electricity-visualizing film" may be stuck to the surface of the measurement object to form the film on the surface of the measurement object.

In the fourth aspect, the static electricity-visualizing film can emit light depending on a charged state of the surface of the measurement object, and therefore the static electricity (distribution) on the surface of the measurement object can be intuitively understood. In addition, the static electricity-visualizing film can be easily formed and stuck to the measurement object without being influenced by the shape of the measurement object. As a result, even if the measurement object has a complicated three-dimensional shape such as a curved face, static electricity (distribution) on the surface can be easily visualized.

A fifth aspect of the present invention consists in a static electricity distribution-visualizing device capable of visualizing a distribution of static electricity charged on a surface of a measurement object, characterized in that the device includes the static electricity-visualizing film according to the fourth aspect formed on the surface of the measurement object, and a visualization unit disposed in the vicinity of the static electricity-visualizing film and stimulating the static electricity-visualizing film to cause the static electricity-visualizing film to emit light.

Since the fifth aspect of the present invention can display the static electricity distribution on the surface of the measurement object so that static electricity can be seen even with naked eyes, the static electricity distribution can be intuitively understood.

In addition, the static electricity-visualizing film according to this aspect can cause a charged region to emit light by stimulation with the visualization unit not only while the surface of the measurement object is charged, but also some time after charging of the surface of the measurement object. As a result, the static electricity distribution on the surface of the measurement object can be visualized not only at the time of charging but also some time after charging (not in real time).

Note that, the static electricity-visualizing film emits light only at the moment of electrostatic charging or at the moment of external stimulation in a charged state. Thus, the film does not emit light in a state the measurement object or the static electricity-visualizing film is charged (no charge transfer).

A sixth aspect of the present invention consists in the static electricity-visualizing device according to the fifth aspect, characterized in that the visualization unit is a contact member which contacts the surface of the static electricity-visualizing film to physically stimulate the static electricity-visualizing film.

Herein, the "contact member" is not particularly limited and may be e.g., a destaticizing brush, or a conductive ($10^{-6}$ to $10^6 \Omega \cdot cm$) object including metal, carbon, or the like. Also, the "physically stimulate" includes lightly stroking the surface of the static electricity-visualizing film with the contact member.

In the sixth aspect, the static electricity distribution can be easily displayed on the surface of the measurement object so that the static electricity distribution can be seen even with naked eyes.

A seventh aspect of the present invention consists in the static electricity-visualizing device according to the fifth aspect, characterized in that the visualization unit is a magnet for applying a magnetic field to the static electricity-visualizing film.

Herein, the "magnet" may be a permanent magnet having unchangeable magnetic field direction and strength or may be an electromagnet or the like having changeable magnetic field direction and strength (e.g., an electromagnet having periodically changeable magnetic field direction and strength).

In addition, a direction of the applied magnetic field may be unchangeable or changeable (e.g., periodically changeable).

In the seventh aspect, the static electricity distribution can be easily displayed on the surface of the measurement object so that the static electricity distribution can be seen even with naked eyes.

An eighth aspect of the present invention consists in the static electricity-visualizing device according to the fifth aspect, characterized in that the visualization unit is a heating device for heating the static electricity-visualizing film.

Herein, the "heating device" is not particularly limited as long as it can heat the static electricity-visualizing film.

In the eighth aspect, the static electricity distribution can be easily displayed on the surface of the measurement object so that the static electricity distribution can be seen even with naked eyes.

A ninth aspect of the present invention consists in the static electricity-visualizing device according to the fifth aspect, characterized in that the visualization unit is a sound wave generator which irradiates the static electricity-visualizing film with a sound wave to vibrate the static electricity-visualizing film.

Herein, the "sound wave generator" is not limited as long as it can emit a sound wave. The sound wave generator includes not only a device capable of generating a sound wave at a human audio frequency (20 Hz to 20000 Hz), but also a device capable of generating an ultrasonic wave at a frequency of 5 20000 Hz or higher, or a device capable of emitting a pulse wave or a shock wave.

In the ninth aspect, the static electricity distribution can be easily displayed on the surface of the measurement object so that the static electricity distribution can be seen even with naked eyes.

A tenth aspect of the present invention consists in the static electricity-visualizing device according to the fifth aspect, characterized in that the visualization unit is an electromagnetic wave generator which emits an electromagnetic wave at a wavelength other than a wavelength of light emitted by the static electricity-visualizing film.

Herein, the "electromagnetic wave generator" is not particularly limited as long as it can emit an electromagnetic wave. Also, a wavelength of a generable electromagnetic wave (e.g., wavelength in a range of 1 m to 1 pm, including microwave, terahertz wave, far-infrared ray, infrared ray, visible light, ultraviolet ray and X-ray) is not particularly limited.

Furthermore, the electromagnetic wave to be emitted may be a continuous electromagnetic wave, an electromagnetic wave which is emitted for a few seconds and then not emitted for a few seconds, or a pulsed electromagnetic wave.

In the tenth aspect, the static electricity distribution can be easily displayed on the surface of the measurement object so that the static electricity distribution can be seen even with naked eyes.

An eleventh aspect of the present invention consists in the static electricity-visualizing device according to the fifth aspect, characterized in that the visualization unit is a stretching/compressing machine for deforming the static electricity-visualizing film together with the measurement object.

Herein, the "stretching/compressing machine" is not particularly limited as long as it can apply a force to the measurement object so as to deform the static electricity-visualizing film together with the measurement object.

In the eleventh aspect, the static electricity distribution can be easily displayed on the surface of the measurement object so that the static electricity distribution can be seen even with naked eyes.

A twelfth aspect of the present invention consists in the static electricity-visualizing device according to the tenth aspect, characterized in that the emitted electromagnetic wave is visible light.

In the twelfth aspect, it is possible to more clearly distinguish between a charged region and an uncharged region by observing an afterglow property of the static electricity-visualizing film excited by irradiation with the visible light.

A thirteenth aspect of the present invention consists in the static electricity-visualizing device according to any one of the fifth to twelfth aspects, characterized in that a film temperature control unit capable of changing a temperature of the static electricity-visualizing film is arranged on or in the vicinity of the static electricity-visualizing film.

Herein, the "film temperature control unit" is not particularly limited as long as it can change a temperature of the static electricity-visualizing film.

In the thirteenth aspect, it is possible to increase a difference in luminance between the charged region and the uncharged region. As a result, it is possible to more clearly distinguish between the charged region and the uncharged region.

A fourteenth aspect of the present invention consists in the static electricity-visualizing device according to any one of the fifth to thirteenth aspects, characterized in that the static electricity-visualizing device further includes a recording unit which is disposed in the vicinity of the static electricity-visualizing film and records a luminescence state of the static electricity-visualizing film.

Herein, the "recording unit" is not particularly limited as long as it can record the luminescence state of the static electricity-visualizing film.

In the fourteenth aspect, the luminescence state of the static electricity-visualizing film can be recorded, and thus the luminescence state of the static electricity-visualizing film can be objectively analyzed.

A fifteenth aspect of the present invention consists in a static electricity distribution-visualizing method capable of visualizing a static electricity distribution charged on a surface of a measurement object, characterized in that the method includes: a step of forming the static electricity-visualizing film according to the fourth aspect on the surface of the measurement object; a step of electrostatically charging at least the surface of the measurement object: and a light-emitting step of causing the static electricity-visualizing film to emit light using a visualization means for stimulating the static electricity-visualizing film.

Herein, the "step of electrostatically charging" is not particularly limited as long as the surface of the measurement object where the static electricity-visualizing film is formed can be electrostatically charged. Examples of the step of electrostatically charging include: bringing an already charged object close to the measurement object or contact with the measurement object via the static electricity-visualizing film, rubbing an uncharged object and the measurement object in a state that they contact each other via the static electricity-visualizing film; peeling the uncharged object from the measurement object from a state that they contact each other via the static electricity-visualizing film; emitting electrons or the like to the surface of the measurement object from a charging device using corona discharge to electrostatically charge the surface of the measurement object where the static electricity-visualizing film is formed; electrostatically charging a back surface of the static electricity-visualizing film in a state that the measurement object is connected to a voltage/current generator or a generator for electricity such as a contact charging, frictional charging, and peeling charging; or the like.

In the fifteenth aspect, the static electricity distribution can be displayed on the surface of the measurement object so that the static electricity distribution can be seen even with naked eyes, and therefore the static electricity distribution can be intuitively understood. In addition, the static electricity-visualizing film can be easily formed and stuck to the measurement object without being influenced by the shape of the measurement object. As a result, even if the measurement object has a complicated three-dimensional shape such as a curved face, the static electricity distribution on the surface can be easily visualized.

In addition, the static electricity-visualizing film according to this aspect can cause the charged region to emit light by stimulation with the visualization means not only while the surface of the measurement object is charged, but also some time after charging of the surface of the measurement object. As a result, the static electricity distribution on the surface of the measurement object can be visualized not only at the time of charging but also some time after charging (not in real time).

Note that, the static electricity-visualizing film emits light only at the moment of electrostatic charging or at the moment of external stimulation in a charged state. Thus, the film does not emit light in a state the measurement object or the static electricity-visualizing film is charged (no charge transfer).

A sixteenth aspect of the present invention consists in the static electricity distribution-visualizing method according to the fifteenth aspect, characterized in that the visualization means is physical stimulation by bringing an object into contact with a surface of the static electricity-visualizing film to stimulate the static electricity-visualizing film.

Herein, the "physical stimulation" also includes lightly stroking the surface of the static electricity-visualizing film with a contact member.

In the sixteenth aspect, the static electricity distribution can be easily displayed on the surface of the measurement object so that the static electricity distribution can be seen even with naked eyes.

A seventeenth aspect of the present invention consists in the static electricity distribution-visualizing method according to the fifteenth aspect, characterized in that the visualization means is a magnetic field or an electric field applied to the static electricity-visualizing film.

In the seventeenth aspect, the static electricity distribution can be easily displayed on the surface of the measurement object so that the static electricity distribution can be seen even with naked eyes.

An eighteenth aspect of the present invention consists in the static electricity-visualizing method according to the fifteenth aspect, characterized in that the visualization means is heat applied to the static electricity-visualizing film.

In the eighteenth aspect, the static electricity distribution can be easily displayed on the surface of the measurement object so that the static electricity distribution can be seen even with naked eyes.

A nineteenth aspect of the present invention consists in the static electricity-visualizing method according to the fifteenth aspect, characterized in that the visualization means is a sound wave which irradiates the static electricity-visualizing film to vibrate the static electricity-visualizing film.

In the nineteenth aspect, the static electricity distribution can be easily displayed on the surface of the measurement object so that the static electricity distribution can be seen even with naked eyes.

A twentieth aspect of the present invention consists in the static electricity-visualizing method according to the fifteenth aspect, characterized in that the visualization means is an electromagnetic wave which irradiates the static electricity-visualizing film and has a wavelength other than the wavelength of light emitted from the static electricity-visualizing film.

In the twentieth aspect, the static electricity distribution can be easily displayed on the surface of the measurement object so that the static electricity distribution can be seen even with naked eyes.

A twenty-first aspect of the present invention consists in the static electricity-visualizing method according to the fifteenth aspect, characterized in that the visualization means is a physical force deforming the static electricity-visualizing film together with the measurement object.

In the twenty-first aspect, the static electricity distribution can be easily displayed on the surface of the measurement object so that the static electricity distribution can be seen even with naked eyes.

A twenty-second aspect of the present invention consists in the static electricity-visualizing method according to the twentieth aspect, characterized in that the electromagnetic wave is visible light.

In the twenty-second aspect, it is possible to more clearly distinguish between the charged region and the uncharged region by observing the afterglow property of the static electricity-visualizing film excited by irradiation with the visible light.

A twenty-third aspect of the present invention consists in the static electricity-visualizing method according to any one of the fifteenth to twenty-second aspects, characterized in that the light-emitting step changes the temperature of the static electricity-visualizing film and then causes the static electricity-visualizing film to emit light using the visualization means.

In the twenty-third aspect, it is possible to increase a difference in luminance between the charged region and the uncharged region. As a result, it is possible to more clearly distinguish between the charged region and the uncharged region.

A twenty-fourth aspect of the present invention consists in the static electricity-visualizing method according to any one of the fifteenth to twenty-third aspects, characterized in that the method further includes a recording step for recording a luminescence state of the static electricity-visualizing film.

In the twenty-fourth aspect, the luminescence state of the static electricity-visualizing film can be recorded, and thus the luminescence state of the static electricity-visualizing film can be objectively analyzed.

DESCRIPTION OF EMBODIMENTS

Embodiments of a static electricity distribution-visualizing method and a static electricity-visualizing device according to the present invention will be explained below with reference to the accompanying drawings. Note that the present invention is not limited to the following embodiments.

Embodiment 1

Figure 1:
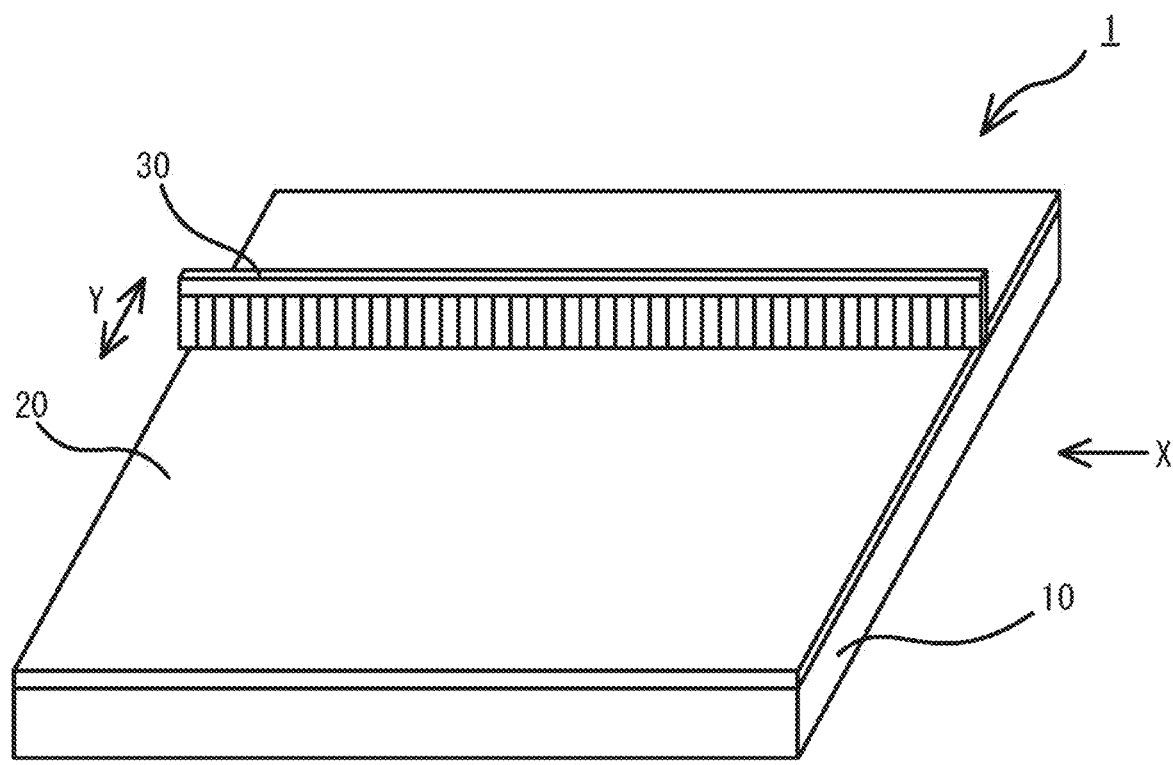
FIG. 1 is a schematic perspective view of a static electricity-visualizing device according to Embodiment 1.
Figure 2:
FIG. 2 is a schematic side view of the static electricity-visualizing device according to Embodiment 1 viewed from X-direction illustrated in FIG. 1.

FIG. 1 illustrates a schematic perspective view of a static electricity-visualizing device according to Embodiment 1, and FIG. 2 illustrates a schematic side view of the static electricity-visualizing device according to Embodiment 1 viewed from X-direction in FIG. 1. As illustrated in these figures, in a static electricity-visualizing device 1 according to Embodiment 1, a static electricity-visualizing film 20 is formed throughout a surface of a rectangular flat measurement object 10, the static electricity-visualizing film 20 containing, as a static electricity-visualizing material, at least one of an fluorescent substance, a luminescent substance, an electroluminescent substance, a breaking luminescent substance, a photochromic substance, an afterglow substance, a photostimulated luminescent substance, and a mechanoluminescent substance.

In addition, on the static electricity-visualizing film 20, a destaticizing brush 30 having a width equal to or larger than breadths of the measurement object 10 and the static electricity-visualizing film is disposed with a jig (not shown) so as to be brought into contact with a surface of the static electricity-visualizing film 20 from one end (right end) to the other end (left end) of the static electricity-visualizing film 20. The static elimination brush 30 can horizontally move freely (in Y-direction) between a lower end and an upper end of the static electricity-visualizing film 20.

Furthermore, a camera (not shown) as a recording unit for recording a luminescence state of the static electricity-visualizing film 20 is fixed above the measurement object 10 with a jig (not shown).

Herein, the static electricity-visualizing film 20 is not particularly limited as long as it is composed of a material containing at least one type of the aforementioned substances. A thickness of the static electricity-visualizing film 20 is not particularly limited, but the thickness is preferably within a range of 1 µm to 1 mm more preferably a range of 10 µm to 500 µm from the viewpoint of an emission intensity and handling ease.

The static electricity-visualizing film 20 may be prepared by, for example, homogeneously mixing: an epoxy resin, an urethane resin, or the like; a curing agent and a solvent for controlling crosslinking/curing reaction of these resins; the above-described substances: and a dispersant/adjuvant for homogeneously dispersing the substances, and applying/curing this mixture on the surface of the measurement object 10. The concentration (weight ratio) of the above-described substances contained in the static electricity-visualizing film 20 is not particularly limited, but a range of 20 wt % to 80 wt % is preferable because light emission can be visually confirmed, and a range of 50 wt % to 70 wt % is more preferable because light emission can be visually confirmed more obviously.

The destaticizing brush 30 as a contact member is not particularly limited as long as it has a static electricity-removing function, and a commercially available destaticizing brush may be used. Also, the measurement object 10 is not particularly limited as long as it can be electrostatically charged. Furthermore, the camera is not particularly limited as long as it can record the luminescence state of the static electricity-visualizing film 20, and a commercially available digital camera or digital video camera can be used.

Figure 3:
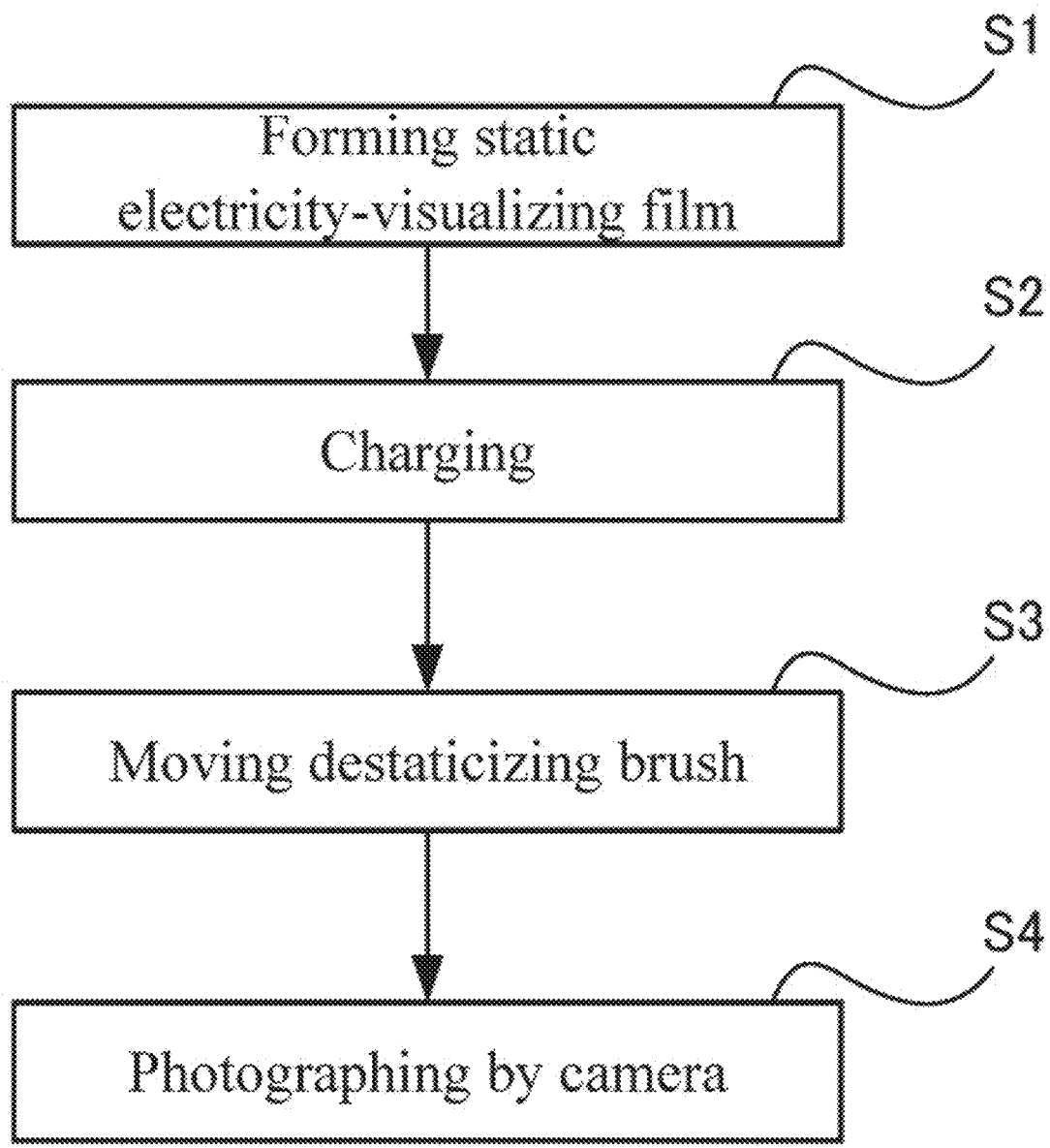
FIG. 3 is an operation flowchart of the static electricity-visualizing device according to Embodiment 1.

Next, an operation of the static electricity-visualizing device 1 (static electricity-visualizing method) according to Embodiment 1 will be explained. FIG. 3 is an operation flowchart of the static electricity-visualizing device according to Embodiment 1.

First, the static electricity-visualizing film 20 is formed on the surface of the measurement object 10 (S1). Then, the surface of the measurement object 10 is electrostatically charged using a charging device or the like (S2).

Subsequently, the destaticizing brush 30 is moved (S3). That is, the destaticizing brush 30 as a visualization means is brought into contact with the surface of the static electricity-visualizing film 20 to physically stimulate the static electricity-visualizing film 20.

Then, the corresponding to static electricity-visualizing film 20 emits light depending on the distribution of static electricity charged on the surface of the measurement object 10. That is, a part of the static electricity-visualizing film 20 corresponding to the static electricity distribution on the surface of the measurement object 10 emits light. At this time, the emission intensity of the luminescent static electricity-visualizing film increases depending on a charged quantity of the measurement object 10. Then, the luminescence is photographed by the camera disposed above the measurement object 10 (S4).

As described above, by configuring the static electricity-visualizing method and the static electricity-visualizing device according to Embodiment 1 can be configured to measure the static electricity distribution of the measurement object which cannot be locally vibrated. Additionally, the static electricity-visualizing film emits light depending on the static electricity distribution of the measurement object, and therefore it is possible to intuitively understand how static electricity is distributed on the surface of the measurement object. Also it is possible to measure the charged quantity distribution of the measurement object 10 by measuring the emission intensity of the static electricity-visualizing film.

Note that, in Embodiment 1, although the destaticizing brush 30 having a width equal to or larger than the breadths of the measurement object 10 and the static electricity-visualizing film 20 is used, the width of the destaticizing brush 30 is not limited. A destaticizing brush 30 having a width smaller than the breadth of the static electricity-visualizing film may be used. When such a destaticizing brush is used, it is necessary to scan the surface of the static electricity-visualizing film 20 with the destaticizing brush, and thereby the same effect as that of the aforementioned static electricity-visualizing device can be obtained.

Additionally, although the destaticizing brush 30 horizontally move freely between the lower end portion and the upper end portion of the static electricity-visualizing film 20 in Embodiment 1, the moving direction of the destaticizing brush 30 is not particularly limited.

Furthermore, although the destaticizing brush 30 is used as the contact member in Embodiment 1, the contact member is not limited to the destaticizing brush 30. For example, a conductive ($10^{-6}$ to $10^{6}\Omega\cdot cm$) object containing metal, carbon or the like may be used as the contact member.

Example 1

A mixture of $SrAl_2O_4$:$Eu^{2+}$ and a photocurable acrylic resin (manufactured by MICROJET Corporation) ($SrAl_2O_4$:$Eu^{2+}$ weight ratio: 70%) was applied on an aluminum foil and cured as a static electricity-visualizing film. Shown are: a result obtained by charging the static electricity-visualizing film for 9 seconds by corona discharge, and then sweeping a surface of the static electricity-visualizing film with a destaticizing brush; and a result obtained by measuring the static electricity-visualizing film charged under the same condition as above by the static electricity distribution-measuring method disclosed in Japanese Patent Application No. 2016-085485.

Figure 4:
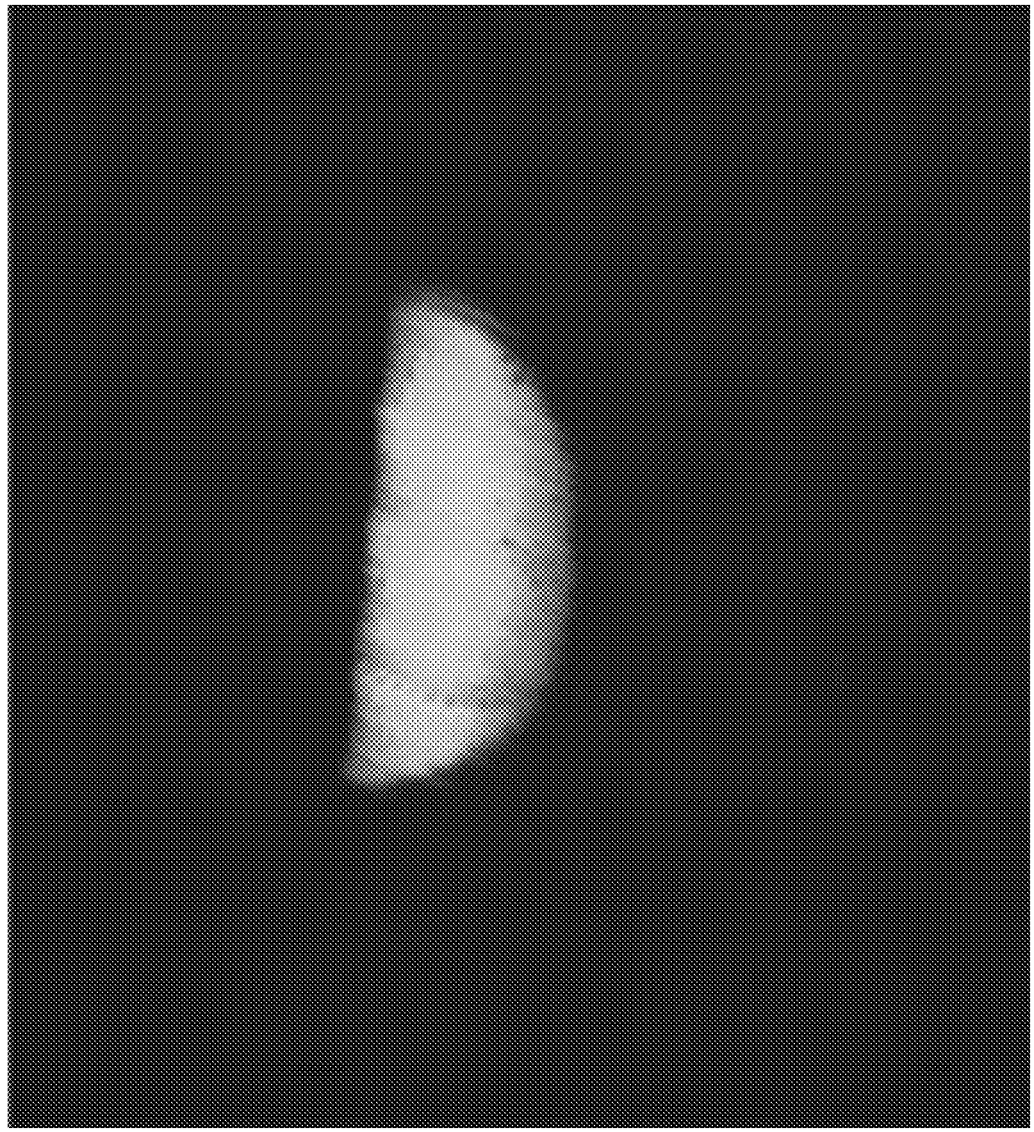
FIG. 4 is a photograph showing a result of sweeping a surface of a static electricity-visualizing film with a destaticizing brush.
Figure 5:
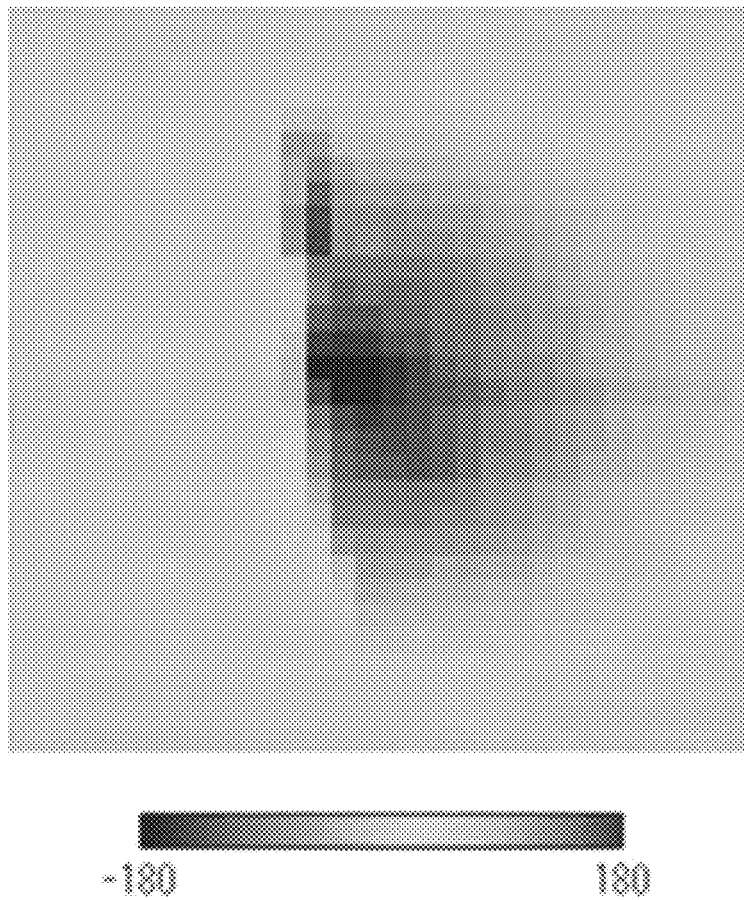
FIG. 5 is a diagram illustrating a charging distribution of a static electricity-visualizing film, measured by a static electricity distribution-measuring method disclosed in Japanese Patent Application No. 2016-085485.

FIG. 4 is a photograph showing a result of sweeping the surface of the static electricity-visualizing film with the destaticizing brush. FIG. 5 is a diagram illustrating a static electricity distribution measured by the electrostatic charging-measuring method disclosed in Japanese Patent Application No. 2016-085485.

As can be seen from FIG. 4 and FIG. 5, it was found that the static electricity distributions of the aluminum foils in FIG. 4 and FIG. 5 almost coincided with each other. That is, it was found that the static electricity distribution could be measured by causing the static electricity-visualizing film to emit light.

Embodiment 2

Although physical stimulation for stimulating the static electricity-visualizing film is used as the visualization means in Embodiment 1, the present invention is not limited thereto. For example, the static electricity-visualizing film may be stimulated using a magnet as the visualization means.

Figure 6:
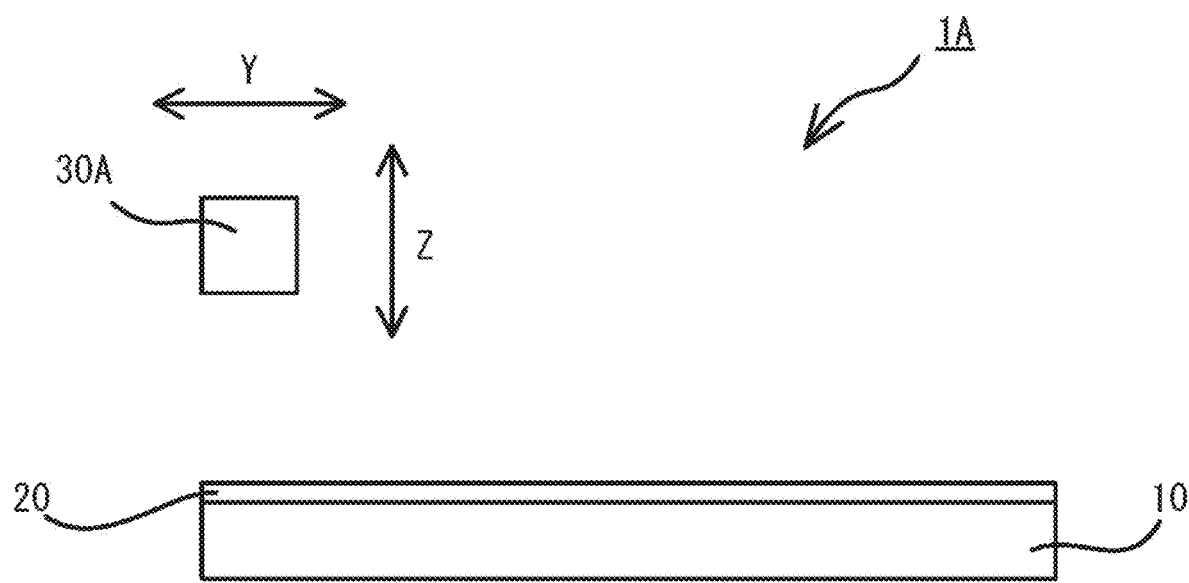
FIG. 6 is a schematic side view of a static electricity-visualizing device according to Embodiment 2.

FIG. 6 is a schematic side view of a static electricity-visualizing device 1A according to Embodiment 2. As illustrated in FIG. 6, the static electricity-visualizing device 1A according to Embodiment 2 has the same configuration as that of the static electricity-visualizing device according to Embodiment 1 except that, instead of the destaticizing brush, a magnet 30A which is a visualization unit having square side faces is disposed above the measurement object 10.

The magnet 30A has a width equal to or larger than breadths of the measurement object 10 and the static electricity-visualizing film 20, arranged so that its position relative to the static electricity-visualizing film 20 can be changed, and can apply a magnetic field to the static electricity-visualizing film 20.

The moving direction of the magnet 30A is not particularly limited. The magnet 30A may move horizontally (in Y-direction) along the surface of the static electricity-visualizing film 20, or may move perpendicularly to the surface of the static electricity-visualizing film 20 (in Z-direction).

Herein, the magnet 30A is not particularly limited as long as it can apply a magnetic field to the static electricity-visualizing film 20, and a permanent magnet or an electromagnet may be used.

Then, in the same procedure as for the static electricity-visualizing device 1 according to Embodiment 1, a magnetic field can be applied to the static electricity-visualizing film 20 to cause the static electricity-visualizing film 20 to emit light. The same effect as that of the static electricity-visualizing device 1 according to Embodiment 1 can also be obtained by such a configuration of the static electricity-visualizing device 1A.

Note that, a width of the magnet 30A used in Embodiment 2 is not particularly limited as is the case with the destaticizing brush according to Embodiment 1. Also, the moving direction of the magnet 30A is not particularly limited. Furthermore, when an electromagnet is used as the magnet 30A, the magnetic field may be applied to the static electricity-visualizing film 20 by changing a direction and an amount (magnitude) of a current flowing through the electromagnet while fixing a relative position between the magnet 30A and the static electricity-visualizing film 20, Embodiment 3

Figure 7:
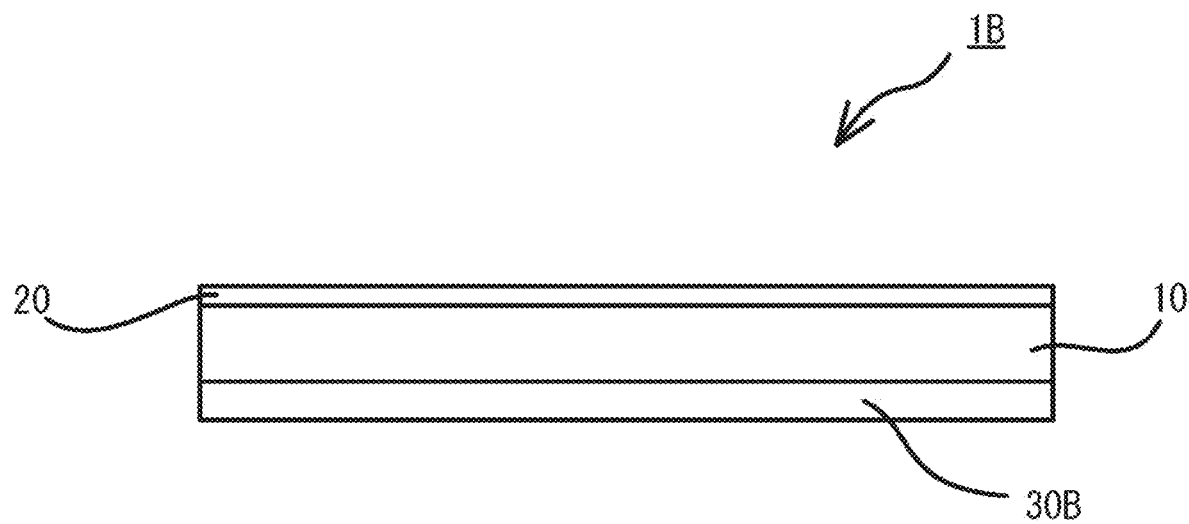
FIG. 7 is a schematic side view of a static electricity-visualizing device according to Embodiment 3.

In Embodiment 3, a case of using heat as a visualization means will be explained. FIG. 7 is a schematic side view of a static electricity-visualizing device 1B according to Embodiment 3. As illustrated in FIG. 7, the static electricity-visualizing device 1B according to Embodiment 3 has the same configuration as that of the static electricity-visualizing device according to Embodiment 1 except that there is no destaticizing brush, the static electricity-visualizing film 20 is formed on one surface of the measurement object 10, and a heater 30B as a heating device is attached to the other surface of the measurement object 10 so as to cover the entire surface.

The heater 30B is connected to a power source (not shown) and can heat (stimulate) the static electricity-visualizing film by heating the measurement object 10.

Herein, a shape, a material and the like of the heater 30B are not particularly limited as long as it can uniformly heat the static electricity-visualizing film 20, and a commercially available heater or the like can be used.

Then, in the same procedure as for the static electricity-visualizing device 1 according to Embodiment 1, the static electricity-visualizing film 20 can be heated to cause the static electricity-visualizing film 20 to emit light.

The same effect as that of the static electricity-visualizing device 1 according to Embodiment 1 can also be obtained by such a configuration of the static electricity-visualizing device 1B.

Note that, although the heater 30B is used as the heating device in Embodiment 3, the present invention is not limited thereto. For example, a single or a plurality of a hot air generator capable of discharging heated air or the like, a halogen lamp, a xenon flash lamp, an infrared heater and the like may be disposed above the static electricity-visualizing film 20, so that the static electricity-visualizing film 20 can be uniformly heated. The same effect can also be obtained by such a configuration of the static electricity-visualizing device.

Embodiment 4

Figure 8:
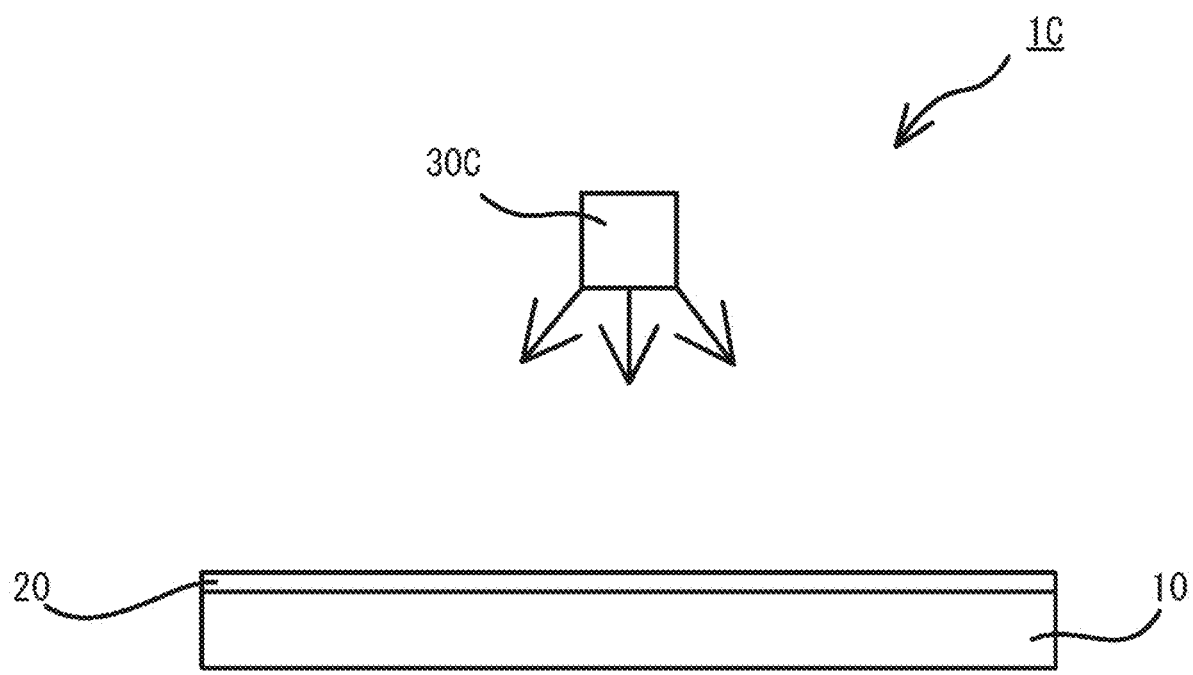
FIG. 8 is a schematic side view of a static electricity-visualizing device according to Embodiment 4.

In Embodiment 4, a case of using a sound wave/electromagnetic wave as a visualization means will be explained. FIG. 8 is a schematic side view of a static electricity-visualizing device 1C according to Embodiment 4. As illustrated in FIG. 8, the static electricity-visualizing device 1C according to Embodiment 4 has the same configuration as that of the static electricity-visualizing device according to Embodiment 1 except that, instead of the destaticizing brush, a sound wave generator 30C which is a visualization unit having square side faces is disposed above the measurement object 10.

The sound wave generator 30C is disposed so that a direction of sound wave irradiation can be arbitrarily changed. The sound wave generator 30C can irradiates a predetermined part of the static electricity-visualizing film 20 with the sound wave to vibrate (stimulate) the part.

Herein, the sound wave generator is not particularly limited as long as it can irradiate the static electricity-visualizing film with a sound wave. The sound wave generator may be not only a device capable of emitting a sound wave at a human audio frequency (20 Hz to 20000 Hz), but also a device capable of emitting an ultrasonic wave at 20000 Hz or higher, or a device capable of emitting a pulse wave or a shock wave.

Then, in the same procedure as for the static electricity-visualizing device 1 according to Embodiment 1, the static electricity-visualizing film 20 is irradiated with a sound wave to cause the static electricity-visualizing film 20 to emit light.

The same effect as that of the static electricity-visualizing device 1 according to Embodiment 1 can also be obtained by such a configuration of the static electricity-visualizing device 1C.

Note that, although the static electricity-visualizing device is configured so as to have one sound wave generator in Embodiment 4, the present invention is not limited to this configuration. It is needless to say that a plurality of sound wave generators may be installed.

Furthermore, an electromagnetic wave generator capable of emitting an electromagnetic wave at a wavelength other than a wavelength of light emitted by the static electricity-visualizing film 20 may be used instead of the sound wave generator 30C to configure the static electricity-visualizing device 1C.

Herein, the electromagnetic wave generator is not particularly limited as long as it can emit an electromagnetic wave. Also, the wavelength of the generable electromagnetic wave (e.g., a wavelength ranging from 1 m to 1 pm, including microwave, terahertz wave, far infrared ray, infrared ray, visible light, ultraviolet ray, and X-ray) is not limited. Examples of the electromagnetic wave generator include an infrared irradiator, an ultraviolet irradiator, an X-ray irradiator, and the like.

The same effect as that of the static electricity-visualizing device 1 according to Embodiment 1 can also be obtained by such a configuration of the static electricity-visualizing device.

Embodiment 5

Figure 9:
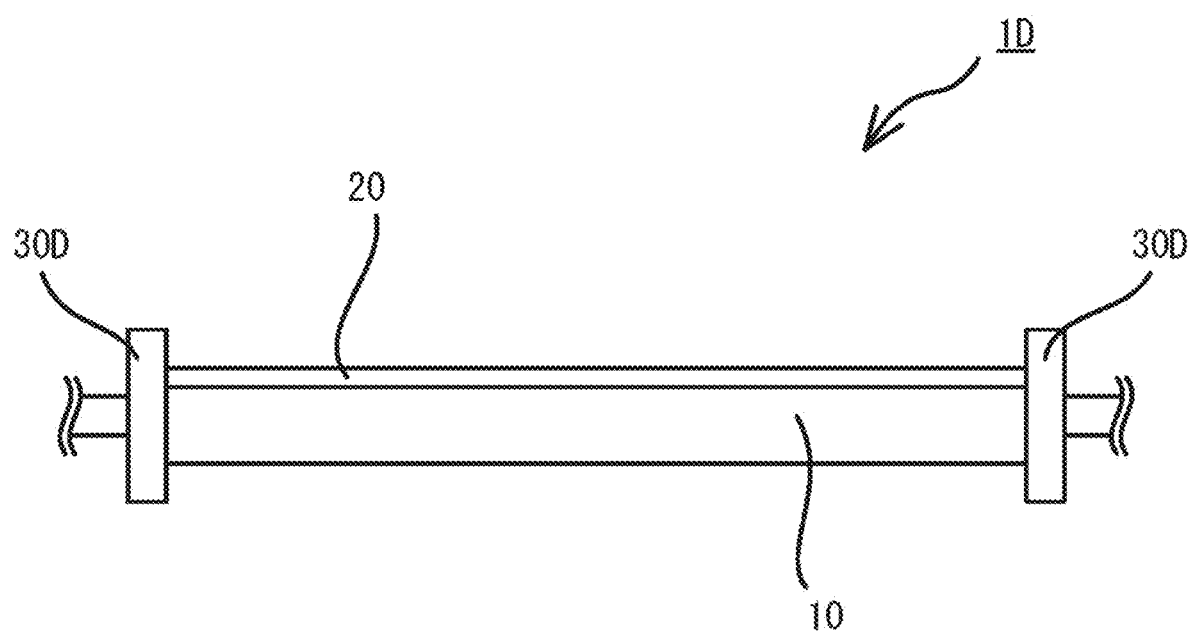
FIG. 9 is a schematic side view of a static electricity-visualizing device according to Embodiment 5.

In Embodiment 5, a case of using a physical force as a visualization means will be explained. FIG. 9 is a schematic side view of a static electricity-visualizing device 1D according to Embodiment 5. As illustrated in FIG. 9, the static electricity-visualizing device 1D according to Embodiment 5 is provided with a load applicator (compressor) 30D as a visualization unit sandwiching the measurement object 10 having the static electricity-visualizing film 20 on the surface so as to apply a physical force to the static electricity-visualizing film 20 together with the measurement object 10.

Herein, the load applicator 30D is not particularly limited as long as it can apply a physical force (compressive force) to the measurement object 10 to deform the static electricity-visualizing film 20 together with the measurement object 10. Examples of the load applicator 30D include a compression tester, a three-point bender, and the like.

Then, in the same procedure as for the static electricity-visualizing device 1 according to Embodiment 1, the static electricity-visualizing film 20 can be deformed together with the measurement object 10 using the load applicator 30D to cause the static electricity-visualizing film 20 to emit light. The same effect as that of the static electricity-visualizing device 1 according to Embodiment 1 can also be obtained by such a configuration of the static electricity-visualizing device 1D.

Note that, in Embodiment 5, although the static electricity-visualizing film 20 is deformed together with the measurement object 10 using the load applicator 30D, the present invention is not limited to this load applicator. For example, the static electricity-visualizing device 1D may be configured using a stretching machine instead of the load applicator 30D.

The stretching machine is also not particularly limited as long as it can apply a physical force (tensile force) to the measurement object 10 to deform the static electricity-visualizing film 20 together with the measurement object 10. Examples of the stretching machine include a tensile tester, a three-point bender and the like.

The same effect as that of the static electricity-visualizing device 1 according to Embodiment 1 can also be obtained by such a configuration of the static electricity-visualizing device 1D.

Other Embodiments

Although the temperature of the static electricity-visualizing film was not changed in the aforementioned embodiments excluding Embodiment 3, a temperature of the static electricity-visualizing film may be increased or decreased during measurement, by arranging a film temperature control unit such as a heater or a Peltier element on or in the vicinity of the static electricity-visualizing film. Herein, the film temperature control unit is not particularly limited as long as it can change the temperature of the static electricity-visualizing film.

As described above, it is possible to increase a difference in light emission luminance between the charged region and the uncharged region by changing the temperature of the static electricity-visualizing film during the measurement. As a result, it is possible to more clearly distinguish between the charged region and the uncharged region.

In addition, although a rectangular flat object was used as the measurement object in the aforementioned embodiments, the shape of the measurement object according to the present invention is not particularly limited. Other examples of the shape of the measurement object include any shapes such as a cubic shape, a rectangular parallelepiped shape, a triangular prism, a triangular pyramid, a spherical shape, an elliptic rotating body shape, an indefinite shape, and the like. The static electricity distribution on the surface of the measurement object having any shape can be visualized.

Furthermore, although a single visualization means or visualization unit was used in the aforementioned embodiments, the present invention is not limited thereto. The same effect can also be obtained by combining a plurality of visualization means or visualization units.

Note that, although the camera as the recording unit was installed so as to record the luminescence state of the static electricity-visualizing film in the aforementioned embodiments, it is needless to say that the luminescence state of the static electricity-visualizing film can be observed with naked eyes without installing a camera.

Furthermore, although the static electricity-visualizing material and the static electricity-visualizing film which include at least one of a fluorescent substance, a luminescent substance, an electroluminescent substance, a breaking luminescent substance, a photochromic substance, an afterglow substance, a photostimulated luminescent substance, and a mechanoluminescent substance were used in the aforementioned embodiments, it is needless to say that a static electricity-visualizing material and a static electricity-visualizing film obtained in which a plurality of substances among these substances are mixed may be used.

REFERENCE NUMERALS 1, 1A, 1B, 1C, 1D static electricity-visualizing device
10 measurement object
20 static electricity-visualizing film
30 destaticizing brush
30A magnet
30B heater
30C sound wave generator
30D load applicator

The invention claimed is:

1. A static electricity-visualizing material containing at least one of a fluorescent substance, a luminescent substance, an electroluminescent substance, a fractoluminescent substance, a photochromic substance, an afterglow substance, a photostimulated luminescent substance and a mechanoluminescent substance,
wherein the static electricity-visualizing material is placed throughout an entire measurement area of a measurement object having a charged portion, and by applying a stimulus and causing the charged portion and its vicinity to emit light, a state of a distribution of charge on or near a surface of the measurement object can be visualized, and
wherein the static electricity-visualizing material is formed onto the entire measurement area of the measurement object without being influenced by the shape of the measurement object.

2. The static electricity-visualizing material according to claim 1, characterized in that a weight ratio of the fluorescent substance, the luminescent substance, the electroluminescent substance, the breaking luminescent substance, the photochromic substance, the afterglow substance, the photostimulated luminescent substance, and the mechanoluminescent substance is 20 to 80 wt %.

3. The static electricity-visualizing material according to claim 1, wherein the mechanoluminescent substance is: a substance represented by $SrAl_2O_4$ which is doped with $Eu^{2+}$; a substance represented by $SrAl_2O_4$ which is doped with at least one of $Eu^{2+}$, $Ho^{3+}$, $Dy^{2+}$, $M_1$, $M_2$ and $M_3$ ($M_1$, $M_2$, $M_3$=monovalent to trivalent metal ions different from each other); or a substance represented by $CaYAl_3O_7$ which is doped with $Eu^{2+}$.

4. A static electricity-visualizing film, wherein the film is disposed on a surface of a measurement object and comprises the static electricity-visualizing material according to claim 1.

5. A static electricity-visualizing device capable of visualizing a distribution of static electricity charged on a measurement object, wherein the device comprises:
the static electricity-visualizing film according to claim 4; and
a visualization unit disposed in the vicinity of the static electricity-visualizing film and stimulating the static electricity-visualizing film to cause the static electricity-visualizing film to emit light.

6. The static electricity-visualizing device according to claim 5 wherein the visualization unit is a contact member which contacts the surface of the static electricity-visualizing film to physically stimulate the static electricity-visualizing film.

7. The static electricity-visualizing device according to claim 5, wherein the visualization unit is a magnet for applying a magnetic field to the static electricity-visualizing film.

8. The static electricity-visualizing device according to claim 5, wherein the visualization unit is a heating device for heating the static electricity-visualizing film.

9. The static electricity-visualizing device according to claim 5, wherein the visualization unit is a sound wave generator which irradiates the static electricity-visualizing film with a sound wave to vibrate the static electricity-visualizing film.

10. The static electricity-visualizing device according to claim 5, wherein the visualization unit is an electromagnetic wave generator which emits an electromagnetic wave at a wavelength other than a wavelength of light emitted by the static electricity-visualizing film.

11. The static electricity-visualizing device according to claim 5, wherein the visualization unit is a stretching/compressing machine for deforming the static electricity-visualizing film together with the measurement object.

12. The static electricity-visualizing device according to claim 10, wherein the emitted electromagnetic wave is visible light.

13. The static electricity-visualizing device according to claim 5, wherein a film temperature control unit capable of changing a temperature of the static electricity-visualizing film is arranged on or in the vicinity of the static electricity-visualizing film.

14. The static electricity-visualizing device according to claim 5, wherein the static electricity-visualizing device further comprises a recording unit which is disposed in the vicinity of the static electricity-visualizing film and records a luminescence state of the static electricity-visualizing film.

15. A static electricity visualizing method capable of visualizing a static electricity distribution charged on a measurement object, wherein the method comprises:
- a step of forming the static electricity-visualizing film according to claim 4 on a surface of the measurement object;
- a step of electrostatically charging at least the surface of the measurement object; and
- a light-emitting step of causing the static electricity-visualizing film to emit light using a visualization means for stimulating the static electricity-visualizing film.

16. The static electricity visualizing method according to claim 15, wherein the visualization means is physical stimulation by bringing a contact member into contact with a surface of the static electricity-visualizing film to stimulate the static electricity-visualizing film.

17. The static electricity visualizing method according to claim 15, wherein the visualization means is a magnetic field applied to the static electricity-visualizing film.

18. The static electricity visualizing method according to claim 15, wherein the visualization means is heat applied to the static electricity-visualizing film.

19. The static electricity visualizing method according to claim 15, wherein the visualization means is a sound wave which irradiates the static electricity-visualizing film to vibrate the static electricity-visualizing film.

20. The static electricity visualizing method according to claim 15, wherein the visualization means is an electromagnetic wave which irradiates the static electricity-visualizing film and has a wavelength other than the wavelength of light emitted from the static electricity-visualizing film.

21. The static electricity visualizing method according to claim 15, wherein the visualization means is a physical force deforming the static electricity-visualizing film together with the measurement object.

22. The static electricity visualizing method according to claim 20, wherein the electromagnetic wave is visible light.

23. The static electricity visualizing method according to claim 15, wherein the light-emitting step changes the temperature of the static electricity-visualizing film and then causes the static electricity-visualizing film to emit light using the visualization means.

24. The static electricity visualizing method according to claim 15, wherein the method further comprises a recording step for recording a luminescence state of the static electricity-visualizing film.

25. The static electricity-visualizing device according to claim 6, wherein the contact member is a destaticizing brush.

26. The static electricity visualizing method according to claim 16, wherein the contact member is a destaticizing brush.

* * * * *